United States Patent [19]
Cheung

[11] Patent Number: 5,471,093
[45] Date of Patent: Nov. 28, 1995

[54] PSEUDO-LOW DIELECTRIC CONSTANT TECHNOLOGY

[75] Inventor: Robin W. Cheung, Cupertino, Calif.

[73] Assignee: Advanced Micro Devices, Inc., Sunnyvale, Calif.

[21] Appl. No.: 330,767

[22] Filed: Oct. 28, 1994

[51] Int. Cl.[6] .................. H01L 23/48; H01L 21/3205; H01L 21/441

[52] U.S. Cl. .................. 257/758; 257/752; 257/763; 257/765; 257/776

[58] Field of Search .................. 257/758, 760, 257/762, 764, 763, 765, 752, 776

[56] References Cited

U.S. PATENT DOCUMENTS

| 4,755,482 | 7/1988 | Nagakubo | 257/774 |
|---|---|---|---|
| 4,933,743 | 6/1990 | Thomas et al. | 257/763 |
| 4,974,055 | 11/1990 | Haskell | 357/71 |
| 4,977,108 | 12/1990 | Haskell | 437/229 |
| 5,028,555 | 7/1991 | Haskell | 437/57 |
| 5,055,427 | 10/1991 | Haskell | 437/203 |
| 5,057,902 | 10/1991 | Haskell | 357/71 |
| 5,060,050 | 10/1991 | Tsuneoka et al. | 257/758 |
| 5,081,516 | 1/1992 | Haskell | 357/42 |
| 5,306,952 | 4/1994 | Matsuura et al. | 257/763 |
| 5,327,011 | 7/1994 | Iwamatsu | 257/758 |
| 5,331,204 | 7/1994 | Kuroda et al. | 257/758 |

Primary Examiner—Robert P. Limanek
Assistant Examiner—Alexander Oscar Williams
Attorney, Agent, or Firm—Benman Collins & Sawyer

[57] ABSTRACT

Capacitance between metal interconnects electrically contacting metal contacts in semiconductor devices comprising doped regions contacted by the metal contacts surrounded by a first interlevel dielectric layer is reduced by (a) electrically contacting a first group of the metal contacts with a first group of first metal interconnects and electrically contacting a second group of the metal contacts with a second group of first metal interconnects, the first metal interconnects formed on a first level and surrounded by a second interlevel dielectric layer; and (b) electrically contacting the second group of first metal interconnects with second metal interconnects by means of metal plugs, the metal plugs surrounded by the second interlevel dielectric layer, and the second metal interconnects surrounded by a third interlevel dielectric layer. Thus, increasing the spacing between adjacent metal interconnects, by moving alternating metal interconnects to a second level, reduces the capacitance between metal interconnects and maintains a desired RC delay. In its simplest form, the number of contacts/vias masking layers as well as metal conductor masking layers is doubled compared to prior art processes. However, employing improved design and layout methodologies, three new metal layers will be used to do the job of two old metal layers. The cost of manufacturing is increased, but the speed is improved by up to 50% without relying on any new, untried material systems.

26 Claims, 2 Drawing Sheets

PSEUDO-LOW DIELECTRIC CONSTANT TECHNOLOGY

TECHNICAL FIELD

The present invention relates generally to multilevel interconnects employed in semiconductor technology, and, more particularly, to fabricating sub-micrometer metal interconnects with a drastic reduction in capacitance.

BACKGROUND ART

The semiconductor industry has been relying on the aluminum-silicon dioxide-based system for the last 30 years. With the ever-increasing demand on performance, this system appears to be inadequate to support the future requirements. Low dielectric constant technologies, the best material of which is air itself, have been proposed to give a breath of life to the aluminum-based system. Some proposals to switch the conductor system from aluminum-based to copper-based have been made.

Most of the proposed solutions work well on computer modeling and on paper. The discussion here will concentrate on the practical aspects of the technology. The main issues addressed are: Time to market, cost of implementation, and return on investment.

The information and entertainment industries provide the driving force for the ever increasing performance enhancement requirements on integrated circuit designers and manufacturers. The industry work-horse, the aluminum-silicon dioxide system, appears to be running out of steam to support those stringent requirements. Customers are requesting higher performance and higher reliability. Based on the summary on the performance of various systems shown in Table 1, it is clear that it will be important to move away from the basic Al-SiO$_2$ system to gain performance. Table 1 lists the relative RC time delay of various metal dielectric systems.

TABLE 1

| Relative Performance of Various Systems | |
| --- | --- |
| Metal-Dielectric System | Relative RC Delay |
| Al-SiO$_2$ | 1.0 |
| Al-k = 2 | 0.5 |
| Cu-SiO$_2$ | 0.67 |
| Cu-k = 2 | 0.31 |
| Al-k = 3.2 | 0.8 |
| Al-k = 3.5 | 0.88 |

The best system proposed is an air-gap (air bridge) metalization system, since the relative dielectric constant of air is 1. This will provide the best RC delay that can possibly be obtained. However, this system will be difficult to manufacture and difficult to ensure quality.

In the progression to 0.5 µm technology, in which the distance between metal contacts is approximately 0.5 µm, capacitance problems have been observed.

In order to maintain the optimum RC delay, it is necessary to reduce capacitance C. Thus, a scheme is required that will enable fabrication of sub-micrometer metal contacts while maintaining optimum RC delay.

DISCLOSURE OF INVENTION

In accordance with the invention, a method is provided for reducing capacitance between metal interconnects in semiconductor devices comprising doped regions contacted by metal contacts surrounded by a first interlevel dielectric layer. The metal interconnects make electrical contact to the contacts. The method comprises:

(a) electrically contacting a first group of the metal contacts with a first group of first metal interconnects and electrically contacting a second group of the metal contacts with a second group of first metal interconnects, the first metal interconnects formed on a first level, the first metal interconnects surrounded by a second interlevel dielectric layer; and (b) electrically contacting the second group of first metal interconnects with second metal interconnects by means of metal plugs, the metal plugs surrounded by the second interlevel dielectric layer, and the second metal interconnects surrounded by a third interlevel dielectric layer.

In its simplest form, the number of contacts/vias masking layers as well as metal conductor masking layers is doubled compared to prior art processes. However, employing improved design and layout methodologies, three new metal layers will be used to do the job of two old metal layers. The cost of manufacturing is increased, but the speed is improved by up to 50% without relying on any new, untried material systems.

Other objects, features, and advantages of the present invention will become apparent upon consideration of the following detailed description and accompanying drawings, in which like reference designations represent like features throughout the Figures.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

BEST MODES FOR CARRYING OUT THE INVENTION

Reference is now made in detail to a specific embodiment of the present invention, which illustrates the best mode presently contemplated by the inventor for practicing the invention. Alternative embodiments are also briefly described as applicable.

Figure 1A:
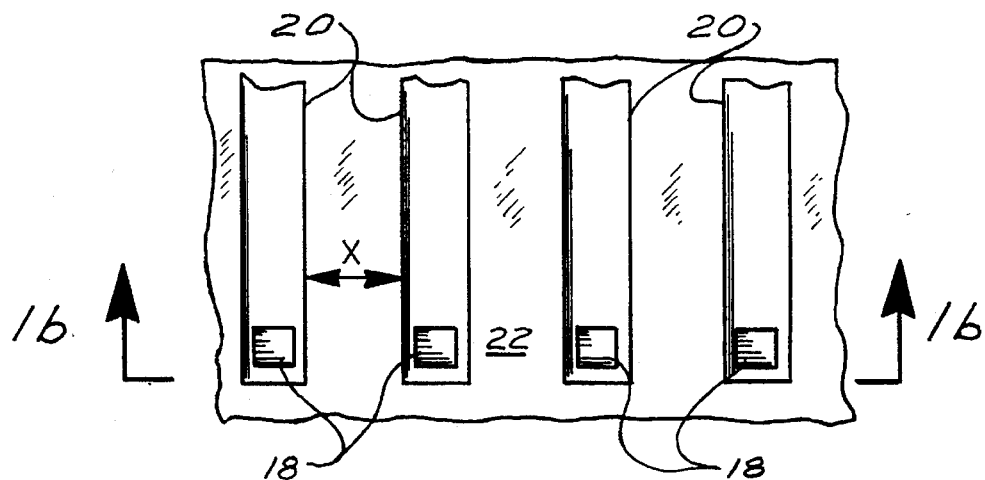
FIG. 1a is a top plan view, depicting the contact/interconnect structure employed in the prior art.
Figure 1B:
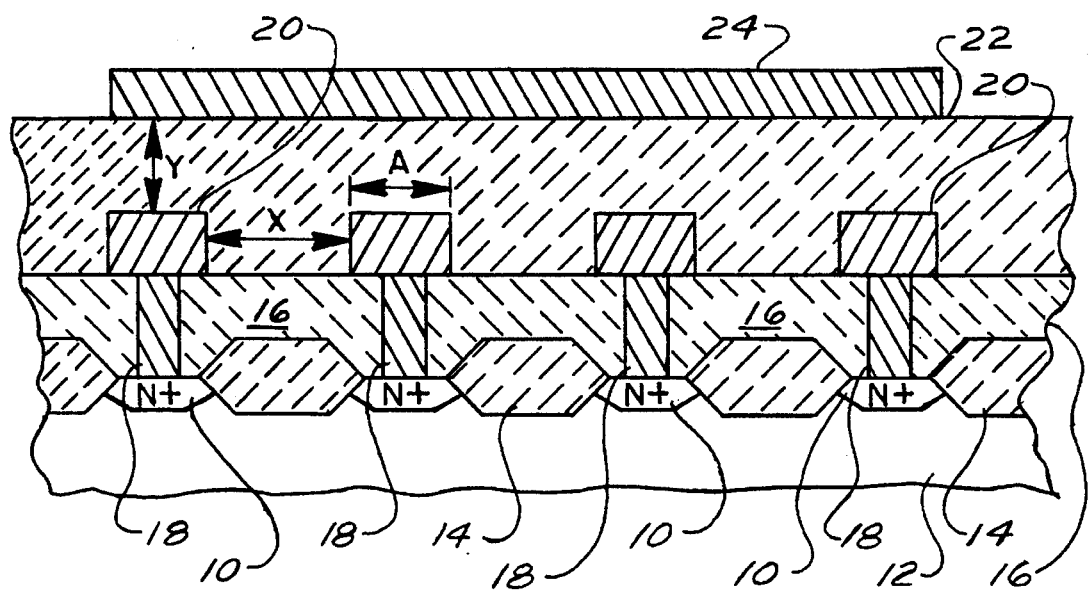
FIG. 1b is a cross-sectional view, taken along the line 1b—1b of FIG. 1a, also depicting the contact/interconnect structure employed in the prior art, with a second layer added for purposes of illustration.

FIGS. 1a and 1b provide a top-plan view and cross-sectional views, respectively, of the present prior art approach to contact/interconnect metalization, employing two layers. This approach has been disclosed and claimed in a series of U.S. patents issued to Jacob D. Haskell and assigned to the same assignee as the present invention. The patents include U.S. Pat. Nos. 4,974,055; 4,977,108; 5,028,555; 5,055,427; 5,057,902; and 5,081,516.

Essentially, a plurality of doped regions 10, shown here N⁺, are formed in a semiconductor substrate 12, such as silicon. A field oxide 14 separates the doped regions 10 from each other. A first planarized interlevel dielectric layer 16 surrounds metal plugs 18, such as tungsten, which contact the doped regions 10. First metal interconnects 20 electrically contact the metal plugs 18 in a predetermined pattern. The metal interconnects are spaced apart by a distance X. In this prior art technology, the value of X is about 0.5 μm (for 0.5 μm design technology).

A second planarized interlevel dielectric layer 22 surrounds the first metal interconnects 20. On top of the second interlevel dielectric layer 22 is formed second metal interconnects 24. The distance from the top of the first metal interconnects 20 to the bottom of the second metal interconnects 24 is denoted Y. In order to control capacitance, the value of Y is in the range of about 0.6 to 1.0 μm.

Figure 2A:
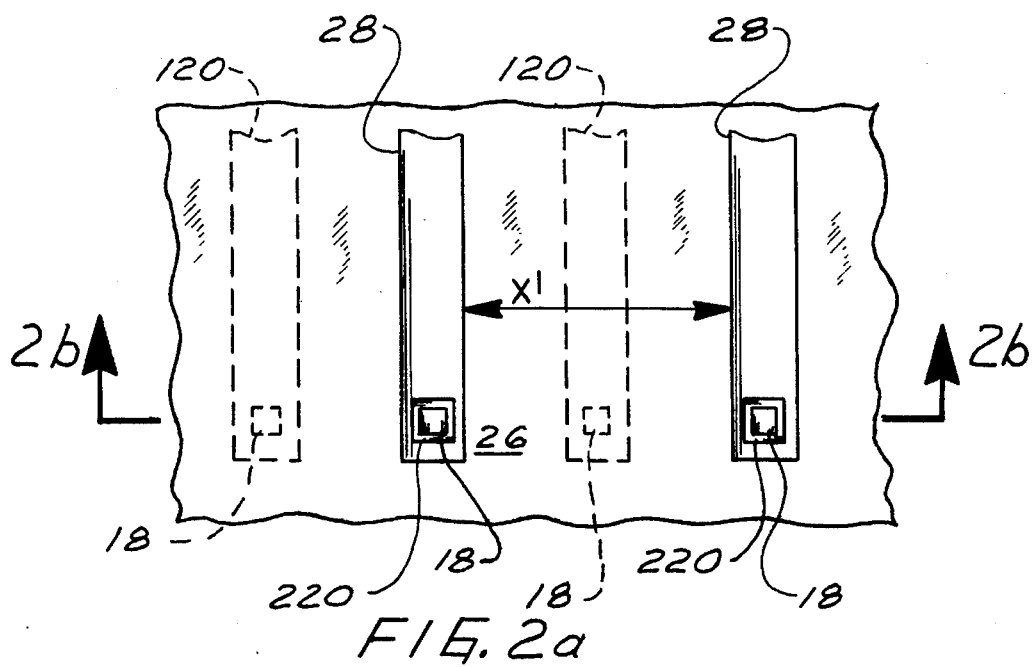
FIG. 2a is a top plan, similar to FIG. 1a, but depicting the contact/interconnect structure of the present invention.
Figure 2B:
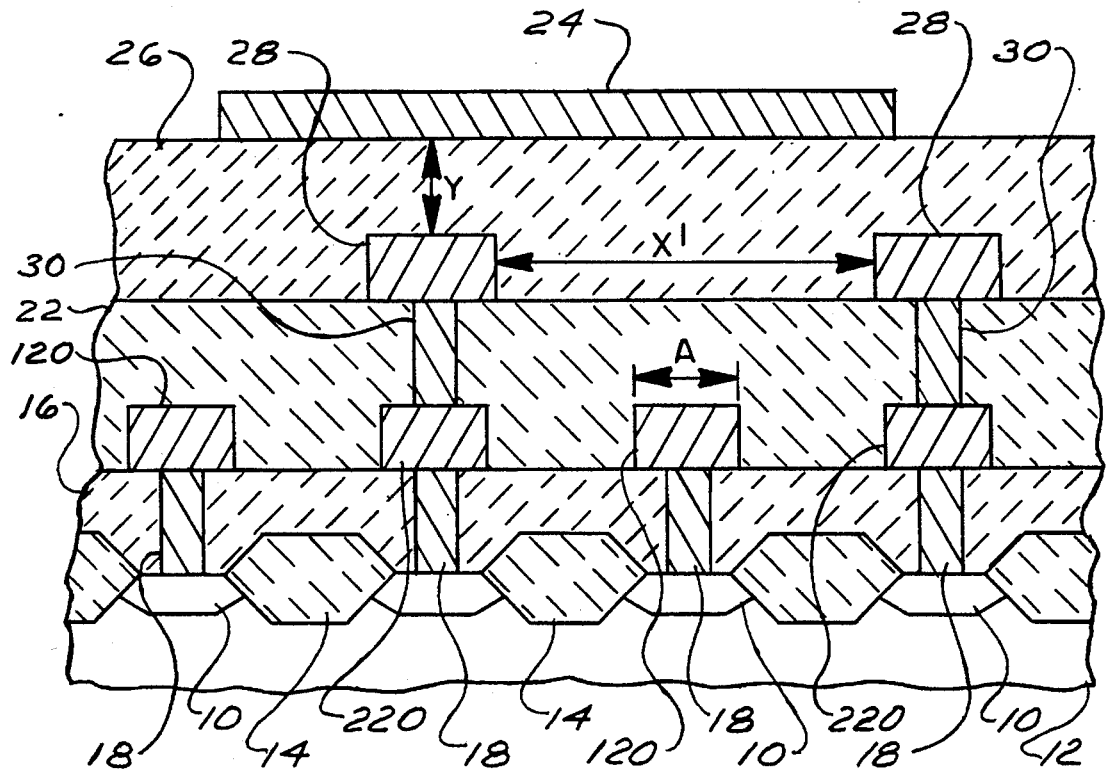
FIG. 2b is a cross-sectional view, similar to FIG. 1b, taken along the line 2b—2b of FIG. 2a, but depicting the contact/interconnect structure of the present invention.

In accordance with the invention, as depicted in FIGS. 2a and 2b, capacitance between adjacent metal interconnects 20 is reduced by providing a third interlevel dielectric layer 26 and making electrical connection to some of the metal plugs (a first group of metal plugs) with a first group of first metal interconnects 120 in the second interlevel dielectric layer 22 as before and making electrical connection to other metal plugs (a second group of metal plugs) with a second group of first metal interconnects 220 which are connected to new second metal interconnects 28. The new second metal interconnects 28 are electrically connected to the second group of first metal interconnects 220 with metal plugs 30, such as tungsten. Connecting every other metal plug 18 in this fashion permits closer spacing of the plugs. The plug spacing is maintained at the same distance X as in the prior art structure. However, the distance between the new second metal interconnects 28 is denoted X' and is at least twice that of X (or $\geq 2X$), and is more than about 1.0 μm (for 0.5 μm design technology).

The maximum dimension of X' is 2X+a, where a is the linewidth dimension of the metal interconnect. Typically, a=X. Consequently, $X' \geq 3X$ (maximum spacing without increasing chip size). For X'<3X, with better layout techniques, the chip size may actually be reduced.

The value of Y remains the same as in the prior art structure. The second metal interconnect 24 of the prior art is now the third metal interconnect, still denoted 24, but now it is on top of the third interlevel dielectric layer 26. The formation of the tungsten plug 30 in vias formed in the second interlevel dielectric layer 22 is as described in the prior art, and the formation of the second metal interconnects 28 and the third interlevel dielectric layer 26 is also as described in the prior art.

Thus, by adding another layer of interlevel dielectric layer and connecting one-half of the metal contacts to interconnects in this layer, the size of the device may be reduced. The RC delay is improved, because the capacitance is correspondingly reduced, due to the increase in spacing between metal interconnects.

The process of the present invention is termed "pseudo-low dielectric constant technology". This technology utilizes all existing production tooling. Process complexity is traded for pseudo-low dielectric constants.

The dielectric materials used are the same as in the prior art process, namely, silicon dioxide ($SiO_2$). The dielectric constant of this material is about 4.0. The process of the present invention employs the same dielectric system, as well as the processing techniques, of the prior art. The same gap-filling technology is used to fill metal spaces and the same oxide polishing techniques are used to provide local and global planarization. The process of the present invention also employs industry-standard tungsten plug and metallization technology.

The metal system used for the interconnect is "pure" aluminum; that is, intentionally undoped aluminum. Alternatively, doped aluminum, doped with copper, titanium, or silicon, may be employed, as is conventional in prior art processes. However, while the metal interconnect preferably comprises an aluminum-containing metal, other metal systems commonly used in semiconductor processing, such as copper, gold, and the like, may also be employed in the practice of the invention.

Further, while tungsten is preferably employed as the metal plug, other metals, such as aluminum alloys, chemically vapor deposited aluminum, copper, gold, or other metal plug materials commonly used in semiconductor processing may also be employed in the practice of the invention.

The process of the present invention is an extension of existing technology. As indicated above, process complexity is traded for lower capacitance in the circuit. However, the dielectric constant itself is not lowered. Rather, the spaces between metal conductors are increased, thereby reducing the capacitance. In its simplest form, the number of contacts/vias masking layers, as well as metal conductor masking layers, is doubled as compared with conventional technologies. With better design and layout methodologies, it is possible to use three new metal layers to do the job of two old metal layers. The cost of manufacturing will be increased; however, the speed of the circuit will be improved up to 50% without relying on any new material systems.

Positive benefits of this approach include:

1. The metal density will be only half as dense (i.e., less sensitive to particle and conductor defects). Therefore, potentially higher yield, even if there are more metal layers;
2. No new production tool set is required;
3. Void-free gap filling will be easy since the metal space is thrice what it was previously; and
4. It can be done now.

Drawbacks of this approach include:

1. It is more costly to process, due to an increase of more than 50% of the number of total steps; and
2. With more conductor layers, the more sensitive the device is to defects (larger ones).

However, in view of the foregoing, it is clear that providing an increase in process complexity to obtain improved performance for sub-0.5 micrometer technology is a worthwhile and acceptable trade-off.

INDUSTRIAL APPLICABILITY

The pseudo-low dielectric approach to sub-0.5 micrometer semiconductor technology is expected to find use in silicon processing.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in other fabrication technologies in MOS or bipolar processes. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. A method of reducing capacitance between metal interconnects electrically contacting metal contacts in semiconductor devices comprising doped regions contacted by said metal contacts surrounded by a first interlevel dielectric layer, said method comprising:

(a) electrically contacting a first group of said metal contacts with a first group of first metal interconnects and electrically contacting a second group of said metal contacts with a second group of first metal interconnects, said first metal interconnects formed on a first level and surrounded by a second interlevel dielectric layer, said first metal interconnects being spaced apart by a distance X; and (b) electrically contacting said second group of first metal interconnects with second metal interconnects by means of metal plugs, said metal plugs surrounded by said second interlevel dielectric layer, and said second metal interconnects surrounded by a third interlevel dielectric layer, said second metal interconnects being spaced apart by a distance X' which is greater than said distance X.

2. The method of claim 1 wherein said metal contacts and said metal plugs consist essentially of tungsten.

3. The method of claim 1 wherein third metal interconnects are formed on top of said third interlevel dielectric layer.

4. The method of claim 3 wherein said first metal interconnects, said second metal interconnects and said third metal interconnects consist essentially of a metal selected from the group consisting of undoped aluminum and doped aluminum.

5. The method of claim 4 wherein said doped aluminum is doped with an element selected from the group consisting of copper, titanium, and silicon.

6. The method of claim 1 wherein said first interlevel dielectric layer, said second interlevel dielectric layer, and said third interlevel dielectric layer each consist essentially of an oxide.

7. The method of claim 6 wherein said oxide consists essentially of silicon dioxide.

8. A method of reducing capacitance between metal interconnects electrically contacting metal contacts in semiconductor devices comprising doped regions contacted by metal contacts surrounded by a first interlevel dielectric layer, each said metal contact electrically contacted by a first metal interconnect surrounded by a second interlevel dielectric layer, said first metal interconnects being spaced apart by a distance X, said method comprising:

(a) selecting metal contacts;

(b) forming vias in said second interlevel dielectric layer to expose a top portion of said selected metal contacts;

(c) filling each said via with a metal plug;

(d) electrically contacting each said metal plug with a second metal interconnect, said second metal interconnects being spaced apart by a distance X' which is greater than said distance X;

(e) forming a third interlevel dielectric layer surrounding said second metal interconnects; and (f) forming third metal interconnects on top of said third interlevel dielectric layer.

9. The method of claim 8 wherein said metal contacts and said metal plugs consist essentially of tungsten.

10. The method of claim 8 wherein said first metal interconnects, said second metal interconnects, and said third metal interconnects consist essentially of a metal selected from the group consisting of undoped aluminum and doped aluminum.

11. The method of claim 10 wherein said doped aluminum is doped with an element selected from the group consisting of copper, titanium, and silicon.

12. The method of claim 8 wherein said first interlevel dielectric, said second interlevel dielectric, and said third interlevel dielectric each consist essentially of an oxide.

13. The method of claim 12 wherein said oxide consists essentially of silicon dioxide.

14. A semiconductor device structure comprising doped regions contacted by metal contacts surrounded by a first interlevel dielectric layer and first metal interconnects formed on top of said first interlevel dielectric layer, said device further comprising:

(a) a first group of said metal contacts in electrical contact with a first group of said first metal interconnects and a second group of said metal contacts in electrical contact with a second group of first metal interconnects, said first metal interconnects surrounded by a second interlevel dielectric layer, said first metal interconnects being spaced apart by a distance X; and (b) said second group of first metal interconnects in electrical contact with second metal interconnects by means of metal plugs, said metal plugs surrounded by said second interlevel dielectric layer, and said second metal interconnects surrounded by a third interlevel dielectric layer, said second metal interconnects being spaced apart by a distance X' which is greater than said distance X.

15. The semiconductor device of claim 14 wherein said metal contacts and said metal plugs consist essentially of tungsten.

16. The semiconductor device of claim 14 further comprising third metal interconnects formed on top of said third interlevel dielectric layer.

17. The semiconductor device of claim 16 wherein said first metal interconnects, said second metal interconnects and said third metal interconnects consist essentially of a metal selected from the group consisting of undoped aluminum and doped aluminum.

18. The semiconductor device of claim 17 wherein said doped aluminum is doped with an element selected from the group consisting of copper, titanium, and silicon.

19. The semiconductor device of claim 14 wherein said first interlevel dielectric layer, said second interlevel dielectric layer, and said third interlevel dielectric layer each consist essentially of an oxide.

20. The semiconductor device of claim 14 wherein said oxide consists essentially of silicon dioxide.

21. The method of claim 1 wherein said distance X' is at least twice said distance X.

22. The method of claim 21 wherein said distance X is about 0.5 μm and said distance X' is greater than about 1.0 μm.

23. The method of claim 14 wherein said distance X' is at least twice said distance X.

24. The method of claim 23 wherein said distance X is about 0.5 μm and said distance X' is greater than about 1.0 μm.

25. The semiconductor device of claim 14 wherein said distance X' is at least twice said distance X.

26. The semiconductor device of claim 25 wherein said distance X is about 0.5 μm and said distance X' is greater than about 1.0 μm.

* * * * *